(12) United States Patent
Holm et al.

(10) Patent No.: US 12,453,018 B2
(45) Date of Patent: Oct. 21, 2025

(54) VIBRATION DAMPED ELECTRONICS ASSEMBLIES FOR PROCESS VARIABLE TRANSMITTERS

(71) Applicant: Rosemount Inc., Shakopee, MN (US)

(72) Inventors: Jacob Daniel Holm, Savage, MN (US); George Charles Hausler, Maple Grove, MN (US); Andrew John Wagener, Maple Grove, MN (US)

(73) Assignee: Rosemount Inc., Shakopee, MN (US)

( * ) Notice: Subject to any disclaimer, the term of this patent is extended or adjusted under 35 U.S.C. 154(b) by 195 days.

(21) Appl. No.: 18/071,788

(22) Filed: Nov. 30, 2022

(65) Prior Publication Data

US 2024/0179854 A1    May 30, 2024

(51) Int. Cl.
*H05K 5/00* (2025.01)
*H05K 5/02* (2006.01)
*H05K 7/14* (2006.01)

(52) U.S. Cl.
CPC ......... *H05K 5/0056* (2013.01); *H05K 5/0217* (2013.01); *H05K 7/1417* (2013.01)

(58) Field of Classification Search
CPC .. H05K 5/0056; H05K 5/0217; H05K 7/1417; H05K 7/142
See application file for complete search history.

(56) References Cited

U.S. PATENT DOCUMENTS

| | | | | |
|---|---|---|---|---|
| 5,187,474 A * | 2/1993 | Kielb | ............ | G08C 19/02 340/870.18 |
| 10,015,899 B2 * | 7/2018 | Hausler | ............ | G01D 11/24 |
| 10,852,165 B1 * | 12/2020 | Davis | ............ | G01C 21/20 |
| 11,122,698 B2 * | 9/2021 | Zack | ............ | H05K 5/0056 |
| 2002/0044416 A1 * | 4/2002 | Harmon, III | ............ | G11B 33/08 |
| 2009/0316372 A1 * | 12/2009 | Kozlovski | ............ | H05K 5/006 361/757 |
| 2014/0198472 A1 * | 7/2014 | Qin | ............ | H05K 5/0217 361/807 |
| 2015/0070864 A1 | 3/2015 | Rainer et al. | | |
| 2015/0085449 A1 * | 3/2015 | Norman | ............ | H05K 5/069 361/728 |

(Continued)

OTHER PUBLICATIONS

Notification of Transmittal of the International Search Report and the Written Opinion of the International Searching Authority from PCT/US2023/034368, dated Jan. 31, 2024.

*Primary Examiner* — Sagar Shrestha
(74) *Attorney, Agent, or Firm* — Westman, Champlin & Koehler, P.A.

(57) ABSTRACT

A process variable transmitter is provided. The process variable transmitter includes a process variable sensor, and an electronics board having circuitry electrically coupled to the process variable sensor. The process variable transmitter also includes a shroud that holds the electronics board, and at least one stop feature to provide vibration damping. A method of manufacturing a process variable transmitter is provided. The method includes providing a process variable sensor. The method also includes providing an electronics board having circuitry configured to electrically couple to the process variable sensor. The method further includes forming a shroud to hold the electronics board, and forming at least one stop feature to support the electronics board when the electronics board is in the shroud.

17 Claims, 6 Drawing Sheets

(56) References Cited

U.S. PATENT DOCUMENTS

| | | | |
|---|---|---|---|
| 2015/0280754 A1* | 10/2015 | Larson | G01D 11/245 |
| | | | 375/295 |
| 2016/0167473 A1* | 6/2016 | Coombs | B60G 17/0526 |
| | | | 280/124.157 |
| 2016/0204535 A1* | 7/2016 | Ye | H01R 13/17 |
| | | | 439/66 |
| 2018/0020558 A1* | 1/2018 | Saito | H05K 5/0082 |
| 2018/0092240 A1* | 3/2018 | Rojahn | H05K 1/18 |
| 2018/0092255 A1* | 3/2018 | Rojahn | H05K 5/006 |
| 2019/0256348 A1 | 8/2019 | Mitchell et al. | |
| 2019/0297724 A1* | 9/2019 | Chiu | H05K 1/181 |
| 2020/0010110 A1* | 1/2020 | Hagiwara | B62D 5/0406 |
| 2020/0097049 A1* | 3/2020 | Dickenson | H05K 1/0215 |
| 2021/0195789 A1* | 6/2021 | Li | H05K 7/20145 |
| 2022/0022329 A1* | 1/2022 | Li | H05K 7/142 |
| 2022/0210932 A1* | 6/2022 | Tada | H05K 5/0217 |
| 2023/0150329 A1* | 5/2023 | Coombs | F15B 13/0814 |
| | | | 280/124.16 |
| 2023/0217585 A1* | 7/2023 | Kim | H05K 1/0271 |
| | | | 174/255 |
| 2023/0354531 A1* | 11/2023 | Lee | H01H 13/04 |

\* cited by examiner

VIBRATION DAMPED ELECTRONICS ASSEMBLIES FOR PROCESS VARIABLE TRANSMITTERS

BACKGROUND

Embodiments of the present disclosure relate to industrial process control systems. More specifically, embodiments of the present disclosure relate to methods to mechanically isolate electronics assemblies of field devices employed in industrial process control systems.

In industrial settings, control systems are used to monitor and control inventories of industrial and chemical processes, and the like. Typically, the control system performs these functions using industrial process field devices distributed at key locations in the industrial process and coupled to the control circuitry in the control system by a process control loop. The term "field device" refers to any device that performs a function in a distributed control or process monitoring system, including all devices currently known, or yet to be known, that are used in the measurement, control, and/or monitoring of industrial processes.

Typical field devices, such as process transmitters, include device circuitry that enables the field device to perform conventional field device tasks such as process parameter monitoring and measurements using one or more sensors, and/or process control operations using one or more control devices. Exemplary sensors include pressure sensors, level sensors, temperature sensors, and other sensors used in industrial processes. Exemplary control devices include actuators, solenoids, valves, and other control devices.

The device circuitry of field devices may also include a controller that is used to control the sensors and/or control devices, and communicate with a process control system, or other circuitry, over a process control loop, such as a 4-20 mA process control loop, for example. In some installations, the process control loop is used to deliver a regulated current and/or voltage to the field device for powering the field device. The process control loop can also carry data, such as a process parameter value corresponding to a sensed process parameter. This data may be communicated over the process control loop as an analog signal, or as a digital signal.

Field devices, such as process transmitters, are expected to be robust against impulse and sinusoidal forces such as impact or vibration. Electronics assemblies inside field devices are subjected to these mechanical forces. Embodiments of the disclosure address dampening the mechanical forces on the electronic assemblies.

SUMMARY

Embodiments of the disclosure relate to vibration damped electronics assemblies for field devices employed in industrial process control systems.

In one embodiment, a process variable transmitter is provided. The process variable transmitter includes a process variable sensor, and an electronics board having circuitry electrically coupled to the process variable sensor. The process variable transmitter also includes a shroud that holds the electronics board, and at least one stop feature to provide vibration damping.

A method of manufacturing a process variable transmitter is provided. The method includes providing a process variable sensor. The method also includes providing an electronics board having circuitry configured to electrically couple to the process variable sensor. The method further includes forming a shroud to hold the electronics board, and forming at least one stop feature to support the electronics board when the electronics board is in the shroud.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION OF ILLUSTRATIVE EMBODIMENTS

Figure 1:
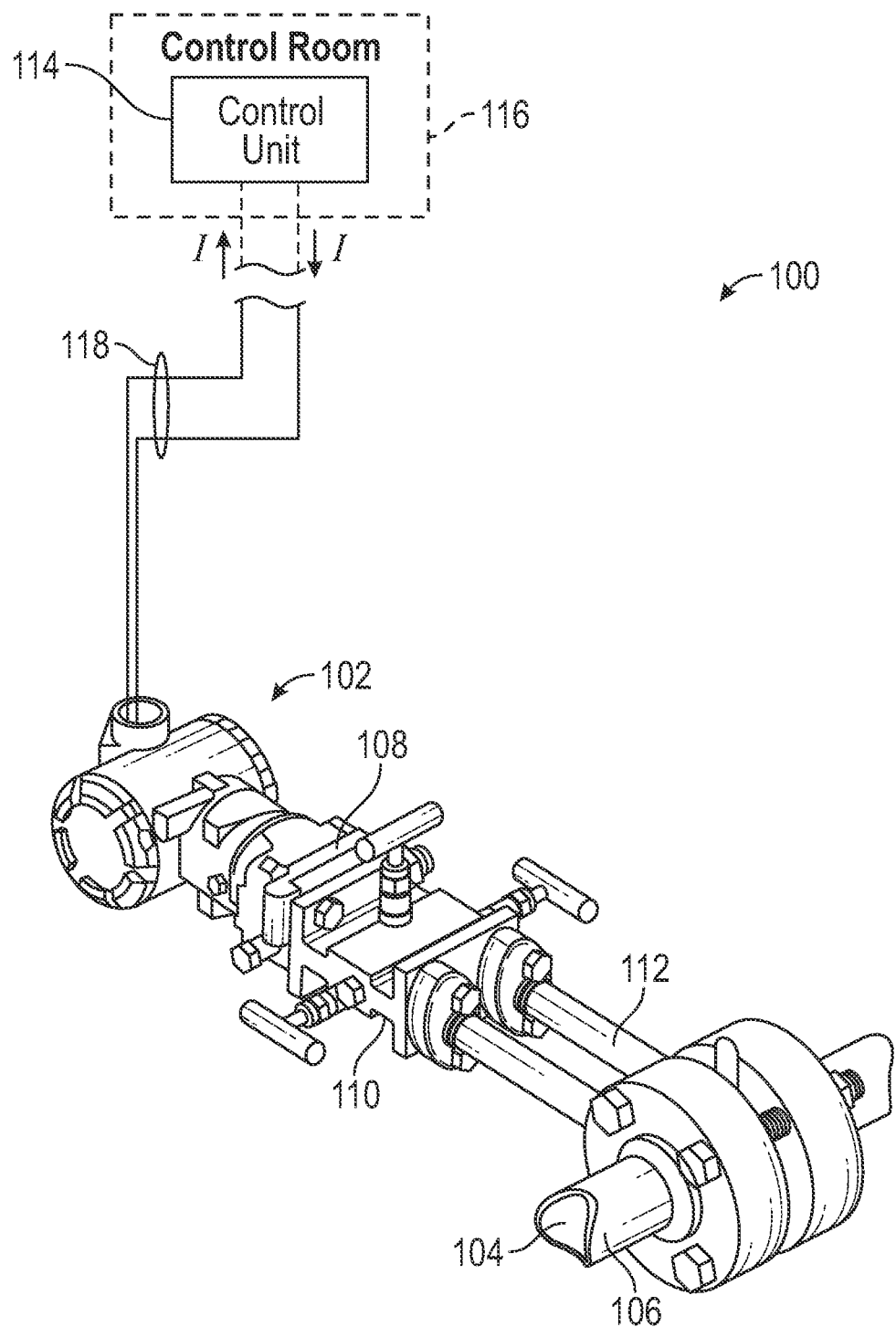
FIG. 1 is a simplified diagram of an exemplary industrial process measurement and/or control system in which embodiments of the present disclosure may be useful.

Embodiments of the present disclosure are described more fully hereinafter with reference to the accompanying drawings. Elements that are identified using the same or similar reference characters refer to the same or similar elements. The various embodiments of the present disclosure may be embodied in many different forms and should not be construed as limited to the specific embodiments set forth herein. Rather, these embodiments are provided so that this disclosure will be thorough and complete, and will fully convey the scope of the present disclosure to those skilled in the art.

Embodiments of the disclosure relate to vibration damped electronics assemblies for field devices. Prior to providing details regarding the different embodiments, a description of an illustrative operating environment is provided below.

As discussed in the BACKGROUND section, field devices are used in industrial settings to measure process variables. Due to the nature of industrial processes, field devices may be exposed to high levels of vibrations or other mechanical shocks, and they must to designed to withstand such events without failing. However, many field devices are manufactured using a modular assembly process in which a number of individual subassemblies are assembled together in a field device housing. The subassemblies need to be securely mounted and electrically connected together. Such mounts and electrical connections can be difficult to maintain when the field device is exposed to mechanical shocks.

FIG. 1 is a simplified diagram of an exemplary industrial process measurement and/or control system 100 in which embodiments of the present disclosure may be useful. The system 100 may be used in the processing of a material to transform the material from a less valuable state into more valuable and useful products, such as petroleum, chemicals, paper, food, etc. For example, the system 100 may be used in an oil refinery that performs industrial processes that can process crude oil into gasoline, fuel oil, and other petrochemicals.

The system 100 includes a field device 102, such as a process transmitter (e.g., a pressure transmitter), that is used to measure and/or control a process, such as a process medium 104. In some embodiments, the process medium 104 may be a fluid (i.e., liquid or gas) that is contained or transported through a process vessel 106, such as a pipe (shown), a tank, or another process vessel. The field device 102 may be coupled to the vessel 106 through an adapter 108, a manifold 110 and a process interface 112, for example.

The field device 102 may communicate with a computerized control unit 114, which may be remotely located from the field device 102, such as in a control room 116, as shown in FIG. 1. The control unit 114 may be communicatively coupled to the field device 102 over a suitable physical communication link, such as a two-wire control loop 118, or a wireless communication link. Communications between the control unit 114 and the field device 102 may be performed over the control loop 118 in accordance with conventional analog and/or digital communication protocols. In some embodiments, the control loop 118 includes a 4-20 milliamp control loop, in which a process variable or other value may be represented by a level of a loop current I flowing through the control loop 118. Exemplary digital communication protocols include the modulation of digital signals onto the analog current level of the two-wire control loop 118, such as in accordance with the HART® communication standard. Other purely digital techniques may also be employed including Fieldbus and Profibus communication protocols.

The field device 102 may also be configured to communicate wirelessly with the control unit 114 using a conventional wireless communication protocol. For example, the field device 102 may be configured to implement a wireless mesh network protocol, such as WirelessHART® (IEC 62591) or ISA 100.11a (IEC 62734), or another wireless communication protocol, such as WiFi, LoRa, Sigfox, BLE, or any other suitable protocol.

Power may be supplied to the field device 102 from any suitable power source. For example, the field device 102 may be wholly powered by the current I flowing through the control loop 118. One or more power supplies may also be utilized to power the field device 102, such as an internal or an external battery. An electrical power generator (e.g., solar panel, a wind power generator, etc.) may also be used to power the field device 102, or to charge a power supply used by the field device 102.

Figure 2:
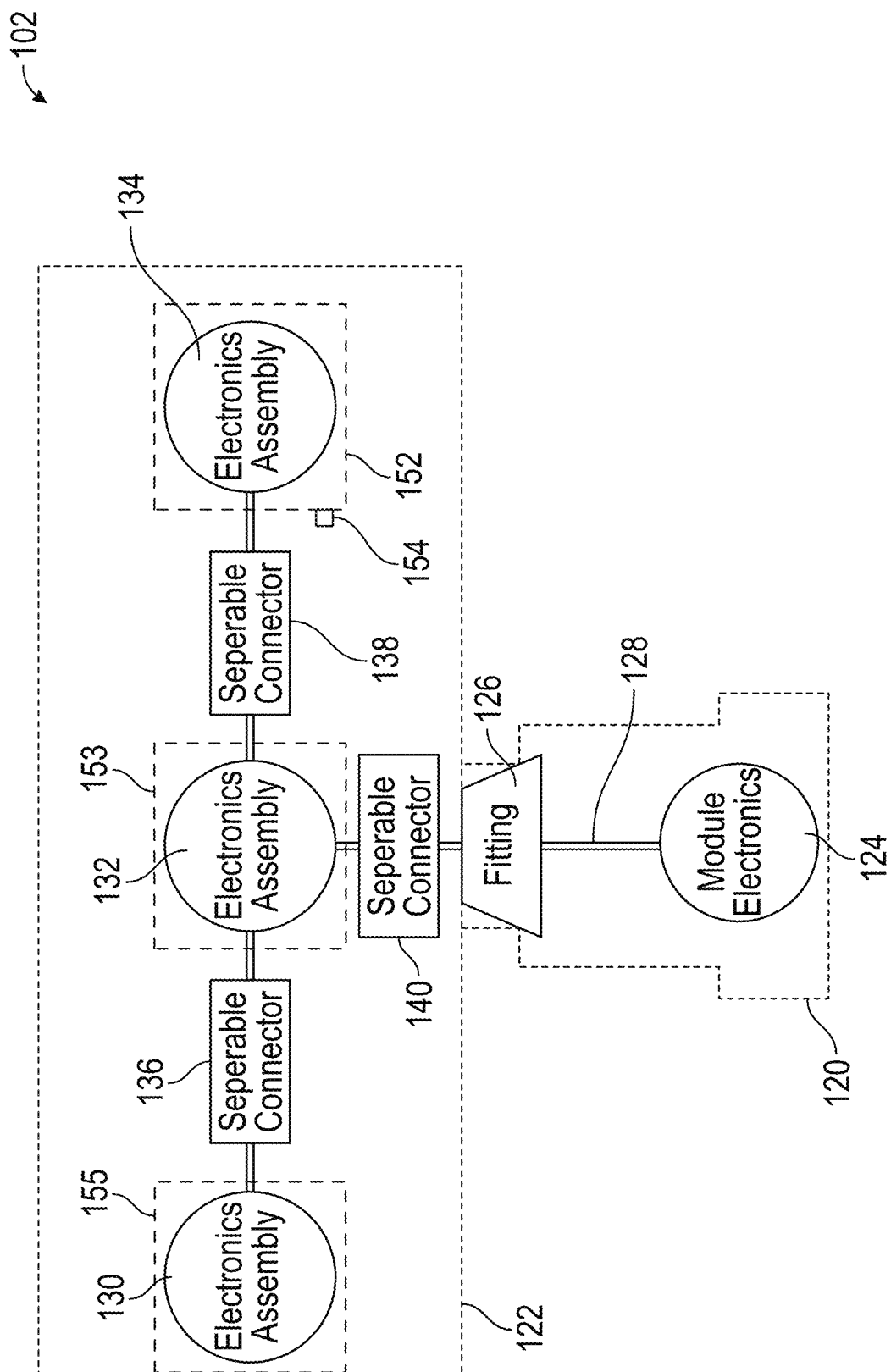
FIG. 2 is a simplified schematic diagram of a process transmitter showing example subassemblies and interconnects.

Process variable transmitters can be of a modular design and enclosed in housing. The housing protects the electronics within the device and, in some configurations, seals the electronics from a hazardous environment. FIG. 2 is a simplified schematic diagram of field device 102 configured as a process transmitter showing example subassemblies and interconnects. The various subassemblies must be securely supported within the housing while maintaining the electrical connections between the components. Further, during transportation, installation and operation, the device may be exposed to various mechanical shocks including impacts and vibrations.

The various subassemblies in a transmitter can be modeled as masses, and the connections between the subassemblies as springs. Mechanical shocks (including vibrations) can act on these masses in different of often opposing ways. The "springs" provided at interfaces between subassemblies must absorb the motion while maintaining the interconnection. The stress can eventually lead to failure of the interconnections. This can be particularly problematic with subassemblies having additional functionality as they may have increased weight and require additional electrical interconnects.

One solution is to require the field device to be mechanically isolated from the environment. However, this requires the problem to be addressed at the installation site during commissioning. Another solution is to reduce the number of subassemblies and implement a monolithic design. However, this increases the complexity of the manufacturing process and reduces the ability to customize production.

The process variable transmitter architecture shown in FIG. 2 is for illustration purposes only. Embodiments of the present disclosure are not limited to any particular transmitter architecture such as the architectures shown in FIG. 2. Embodiments of the present disclosure are illustratively practiced within any number of different types of process transmitter architectures. In FIG. 2, processor variable transmitter 102 includes a sensor module 120 and a transmitter housing 122. Sensor module 120 includes module electronics 124 and an electrical interconnect fitting 126, which is connected to the module electronics 124 by first connectors (e.g., inseparable connections) 128. Transmitter housing 122 includes a first electronics assembly 130, a second electronics assembly 132, and a third electronics assembly 134. Assemblies 130, 132 and 134 may also be referred to as electronics boards. In one specific configuration, first electronics assembly 130 is a terminal block for communication with external components such as process control loop 118. Second electronics assembly 132 can include a microprocessor and/or communication circuitry coupled to assembly 130 by a second connector (e.g., a separable connector) 136. Assembly 132 also electrically connects to module electronics 124 through separable connector 140. Electronics assembly 134 can comprise a local interface such as inputs used in device configuration, a display, wireless communication circuitry, etc. Assemblies 132 and 134 connect together by a third connector (e. g., a separable connector) 138. FIG. 2 also illustrates shrouds 152, 153 and 155 used to support assemblies 134, 132 and 130, respectively. Embodiments of the disclosure provide improved mounts between electronic assemblies that are capable of absorbing vibratory energy and reducing the ability of the connected elements to oscillate contrarily for better vibration damping.

Figure 3:
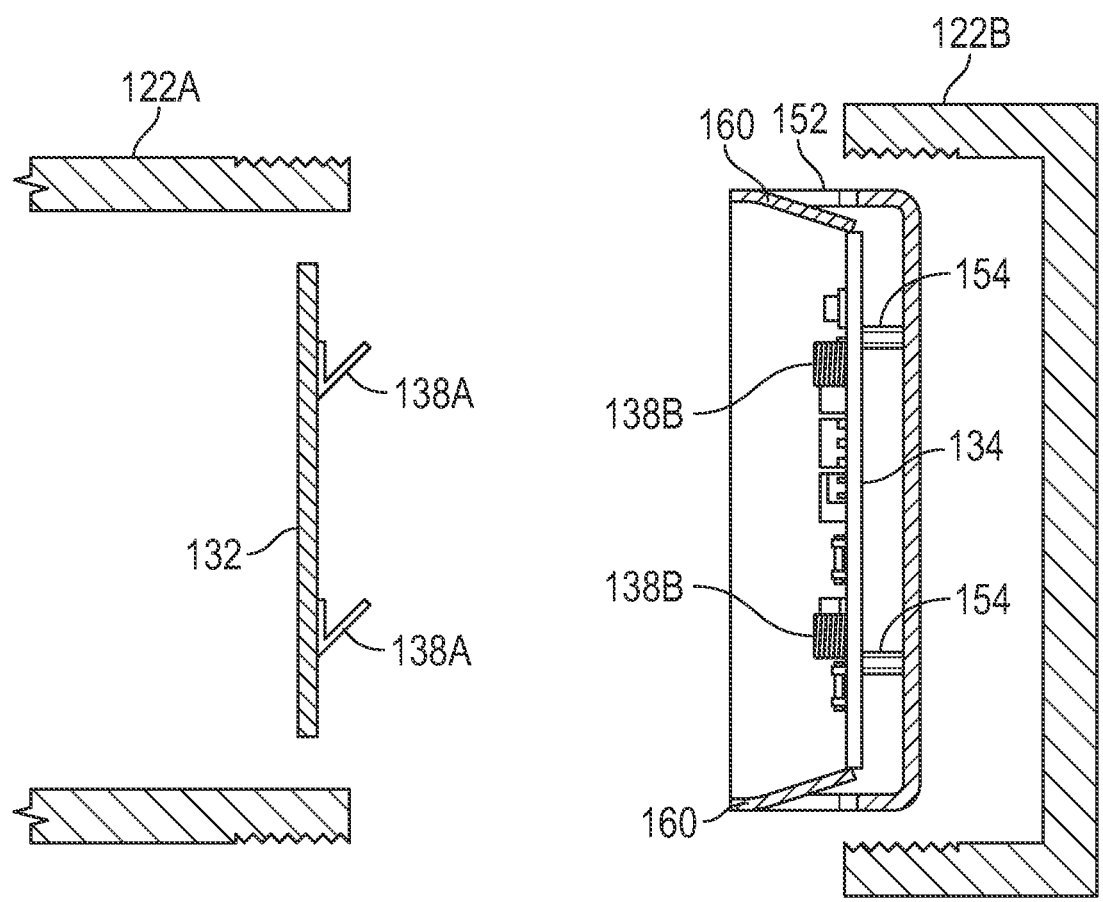
FIG. 3 is a simplified exploded view showing an electronics board and a shroud for holding the electronics board.

Various techniques have been used in the prior art to mount electronic subassemblies within a field device housing. In general, these have used rigid connections and/or cables which run between the various components to support electronics within field devices. Embodiments of the present disclosure employ plastic shrouds with over-molded elastomer stops to support electronics boards. A general embodiment is described below in connection with FIG. 3. FIG. 3 is a simplified exploded view of an example configuration of the invention in which electronics assembly 134 is suspended in housing 122 and insulated from external mechanical shocks including vibrations using elastomeric stops 154. In FIG. 3, housing 122 is illustrated as a main body 122A having threads which receive a cover 122B. Separable connector 138 is illustrated as spring connectors 138A carried on assembly 132 and electrical pads 138B carried on assembly 134. Electronic assembly 134 is positioned in the housing 122 and shroud 152 abuts cover 122 which urges electronic assembly 134 against electronics assembly 132. However, other techniques can also be employed to provide separable electrical connector 138.

Assembly 134 is secured in shroud 152 using a locking mechanism 160 which urges assembly 134 against elastomeric stops 154. In this example configuration, locking mechanism 160 comprises spring-loaded tabs (or snaps) which hold assembly 134 in position. The use of a spring-loaded electrical interconnection 138, locking mechanism 160 along with elastomeric stops 154 allows for limited motion of assembly 134 within the housing 122 while absorbing and damping external shocks including vibrations.

Figure 4A:
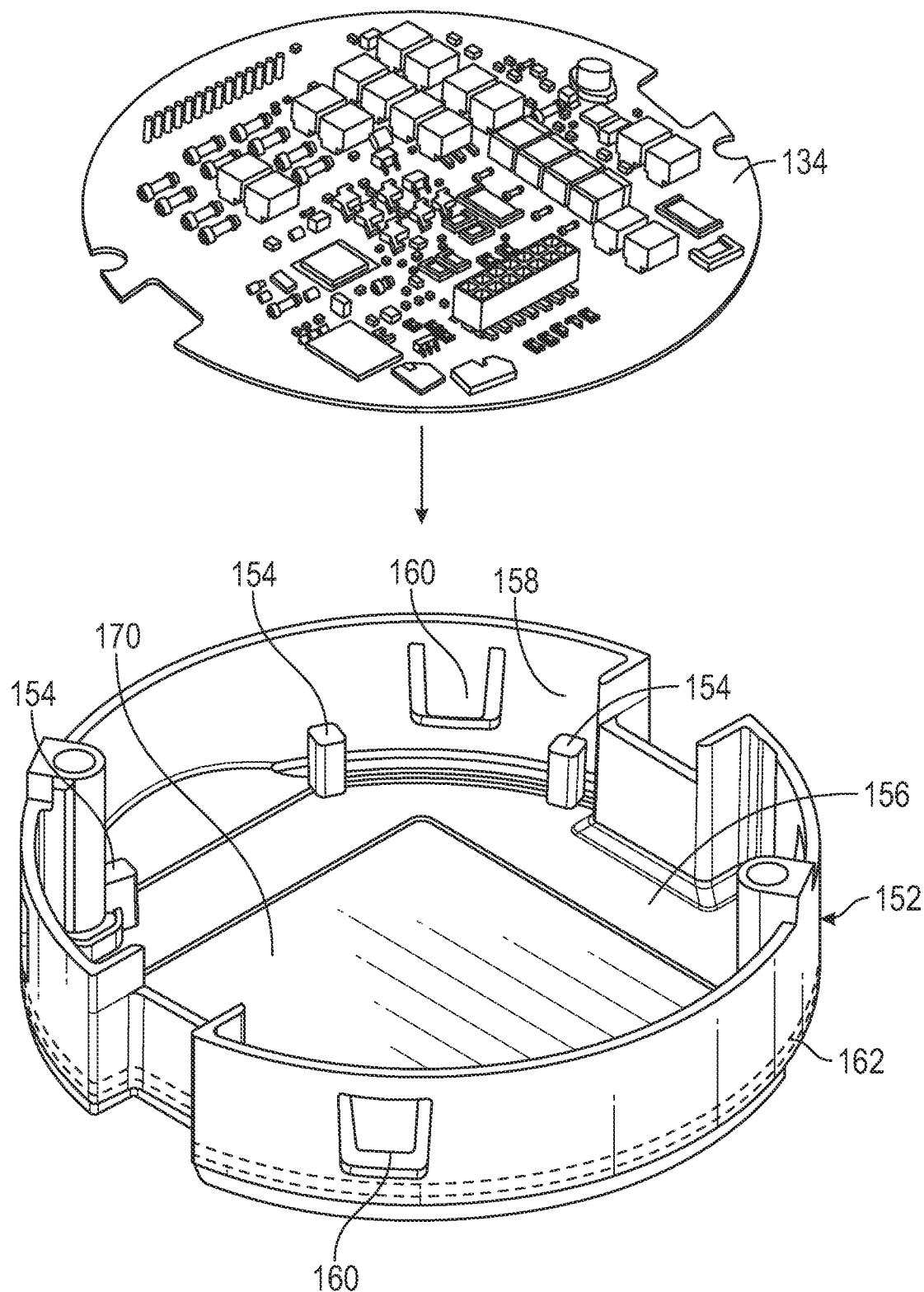
FIG. 4A is a more detailed exploded view and FIG. 4B is an assembled view showing an example embodiment of the electronics board and shroud for holding the electronics board.
Figure 4B:
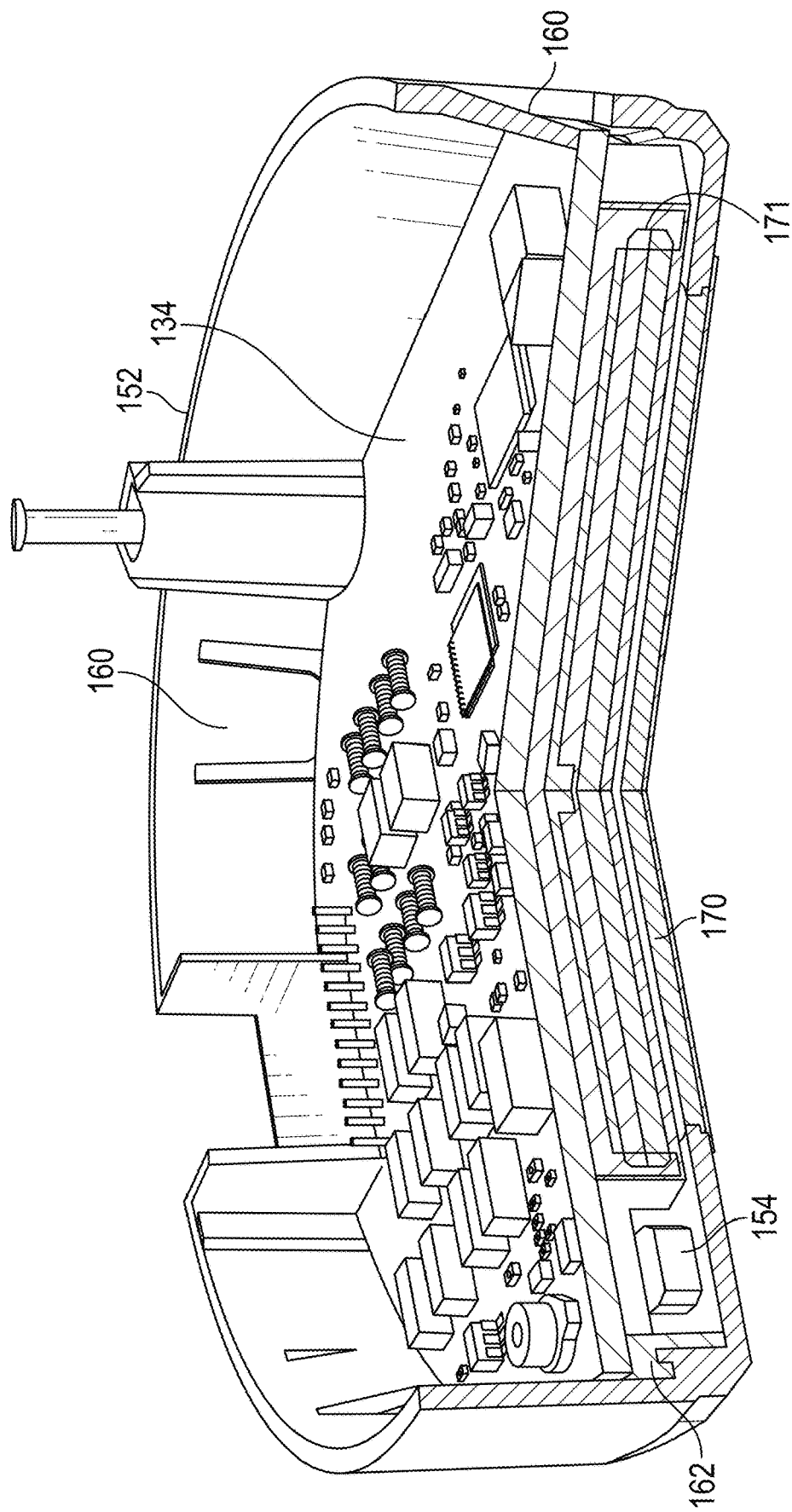

FIG. 4A is an exploded view and FIG. 4B is an assembled view of a specific embodiment showing electronics assembly 134 and shroud 152 for supporting the electronics assembly 134. FIG. 4B also shows optional display 171 which is not visible in FIG. 4A. The figures also illustrate optional window 170 for configurations in which electronics board 134 includes a display. In accordance with one embodiment of the disclosure, one or more stops 154 are provided as vibration-damping or protection features and are over-molded onto the shroud 152 to help support/protect the assembly 134 when it is positioned within the shroud 152. In general, the support/protection features may be over-molded on any suitable location on the interior and/or exterior of shroud 152. Although shroud 152 is shown as a single piece in FIGS. 4A, 4B, multi-piece shrouds with over-molded features between the multiple pieces may also be employed. Also, different shrouds 153, 155 may be employed to support different electronics boards, and over-molded features may be added where one shroud makes contact with another shroud. In some embodiments, shroud 152 may be formed of plastic and the over-molded features may be formed of a suitable elastomer.

In some embodiments, the over-molded features are elastomeric stops 154 that are formed on a base 156 in an interior of the shroud 152. Any suitable number of elastomeric stops 154 may be employed. In some embodiments, the elastomeric stops 154 are located near a perimeter of the shroud 152 as shown in FIG. 4 to utilize the stiffness provided by wall 158 of the shroud 152. When the electronics board 150 is inserted into the shroud 152 and clamped between snaps 160 of the shroud 152 and the elastomeric stops 154, the over-molded elastomeric stops 154 are compressed and act as springs to provide vibration damping. It should be noted that the pillar-shaped stops 154 are a non-limiting example, and in different embodiments, the over-molded features in the interior of the shroud 152 may have any suitable shape and may be positioned in different suitable locations. For example, an elastomeric ring 162 can be provided to provide further support and damping to board 134. The ring 162 can be formed in shroud 152 and over molded with elastomeric material. Although the embodiment of FIGS. 4A, 4B shows the electronics board 150 clamped by snaps 160, in general, the over-molded features may be configured to hold an electronics assembly such as 134 in place with or without such snaps. Further, stops 154 may be provided by other techniques and are not limited to over molding. For example, separate elastomeric elements can be attached to shroud 152 and/or assembly 134. Any type of retention mechanism 160 can also be employed.

Figure 5:
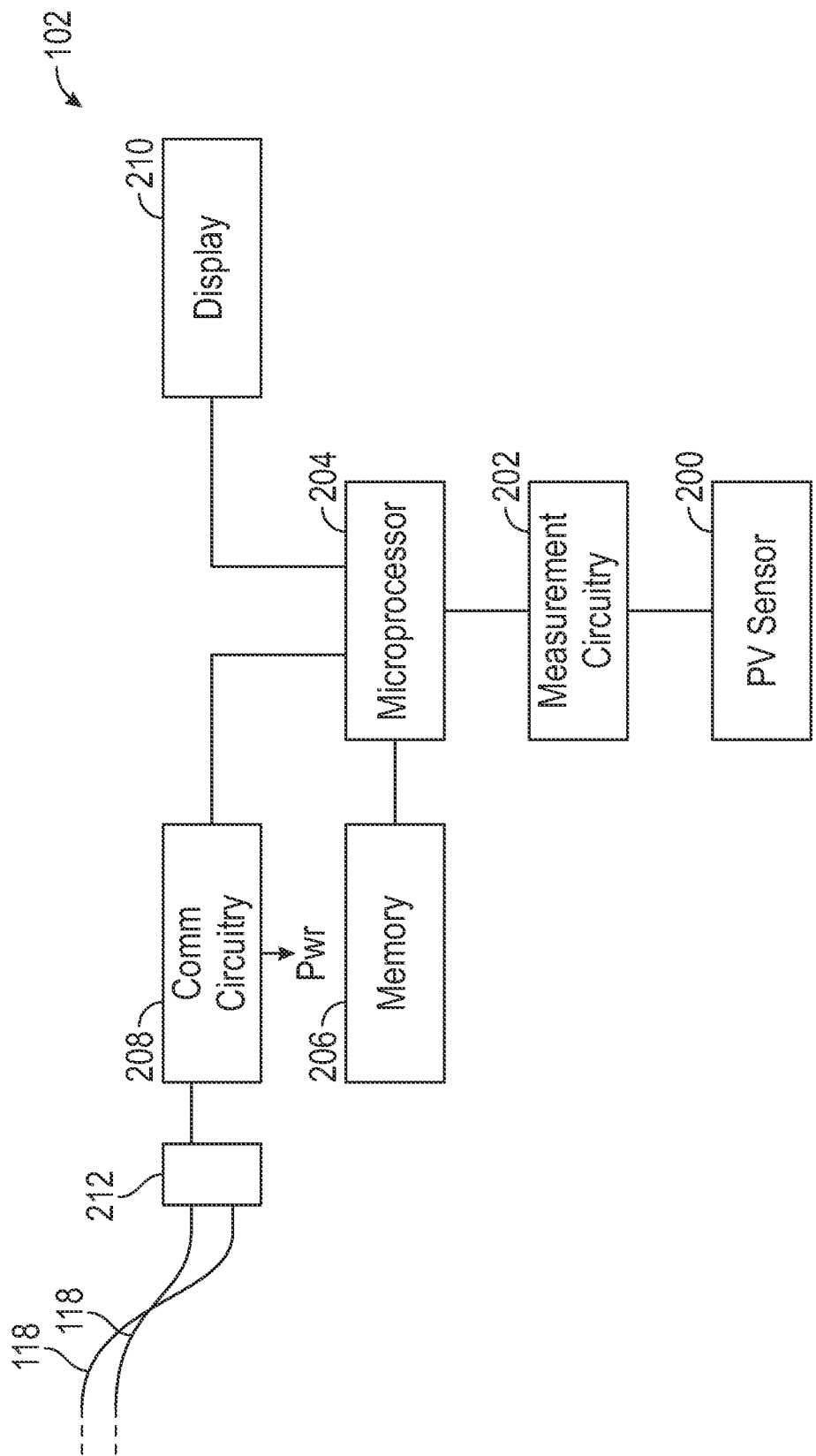
FIG. 5 is a simplified block diagram of electrical components of the process variable transmitter of FIG. 1.

FIG. 5 is a simplified block diagram of process variable transmitter 102 which includes a process variable sensor arranged to sense a process variable, such as process pressure. Measurement circuitry 202 receives an output from the process variable sensor 200 and provides a digitized output related to the sense pressure to a microprocessor 204 which operates in accordance with instructions stored in a memory 206. Transmitter 102 communicates on process control loop 118 using communication circuitry coupled to a terminal block 212. Communication circuitry may also provide a power output with power from loop 118 used to power the transmitter 102. In this configuration, a display 210 couples to microprocessor 204 and can be used, for example, to provide a local output indicative of the sensed process pressure. In one example configuration, terminal block 212 is located on assembly 130 (see FIG. 2), memory 206, microprocessor 204 and communication circuitry 208 are located on assembly 132, and display 210 is located on assembly 134. In some configurations, electronics assembly 134 is provided with additional features or functionality. This can include additional components which may not only cause the assembly 134 to have increased weight, but also may require improved isolation from shocks and vibration when employing delicate circuit components. The mounting configurations set forth herein provide such improved isolation.

In the embodiments described above the stops 154 are included in an interior of the shroud. However, in different embodiments, the stops 154 may be included on any suitable location between the shroud and/or electronics assembly. Stops 154 may be added to stand-offs between shrouds to damp vibration effects between shrouds in, for example, embodiments in which separate shrouds 152, 153 and 155 shown in FIG. 2 are employed for the different electronics assemblies 134, 132 and 130. Stops 154 may be added on external surfaces of the shrouds to provide mechanical isolation there between. In some embodiments, stops 154 may be used between a transmitter housing, or cover, and the plastic of an electronics assembly or shroud within the housing. The shroud 152 can be fabricated using known molding techniques. Similarly, stops 154 can be molded with the shroud 152 and subsequently over molded with an elastomeric material.

In addition to the advantages of embodiments of the disclosure described above, elastomer stops employed in electronics assemblies of process transmitters in a manner described above reduce translational movement of electronics through increased friction and by the high clamping force achieved between the electronics and the shroud. The elastomer takes loading and thereby removes need for other physical anchoring or mounting hardware such as screws or potting. The elastomer stop allows a rigid interconnect system. The stop also improves rigidity of the complete assembly by structural coupling of the printed circuit board and the electronics with the plastic shroud. Vibration damping of over-molded plastic protections expands a vibration rating of an entire assembly beyond individual component ratings.

Although the embodiments of the present disclosure have been described with reference to preferred embodiments, workers skilled in the art will recognize that changes may be made in form and detail without departing from the spirit and scope of the present disclosure. The stops should be positioned between components and do not necessarily need to be fabricated on one particular component.

What is claimed is:
1. A process variable transmitter for use in an industrial process, comprising:
   a housing;
   a process variable sensor configured to sense a process variable of the industrial process;
   a first electronics board in the housing including a microprocessor electrically coupled to the process variable sensor and configured to receive the sensed process variable;
   a second electronics board in the housing comprising a local interface electrically coupled to the microproces- sor and configured to communicate information related to the sensed process variable;

a spring loaded electrical interconnection which electrically couples the first electronics board to the second electronics board;

a shroud that holds and contains the second electronics board;

at least one elastomeric stop feature positioned between the shroud and the second electronics board to provide vibration damping to the electronics board to maintain the electrical interconnection between the second electronics board and the first electronics board, and a locking mechanism which urges the second electronics board against the at least one elastomeric stop feature, wherein the spring loaded electrical interconnection, locking mechanism and at least one elastomeric stop feature provides for limited motion of the second electronics board while absorbing and damping external shocks and vibrations.

2. The process variable transmitter of claim 1, wherein the at least one elastomeric stop feature is positioned in an interior of the shroud.

3. The process variable transmitter of claim 1, wherein the at least one elastomeric stop feature is positioned on an exterior of the shroud.

4. The process variable transmitter of claim 2, wherein the at least one elastomeric stop feature is located on a base of the shroud in the interior of the shroud and extends upwardly from the base of the shroud.

5. The process variable transmitter of claim 1, wherein the at least one elastomeric stop feature is an over-molded feature.

6. The process variable transmitter of claim 5, wherein the over-molded feature is over-molded on the shroud.

7. The process variable transmitter of claim 1, wherein the shroud is a single-piece plastic shroud.

8. The process variable transmitter of claim 1, wherein the shroud is a multi-piece plastic shroud in which the at least one elastomeric stop feature is included between the multiple pieces of the shroud.

9. The process variable transmitter of claim 1, further comprising a shroud that holds additional electronics, wherein the at least one elastomeric stop feature is positioned between the shroud that holds the second electronics board and the shroud that holds the additional electronics.

10. The process variable transmitter of claim 1, wherein the retaining mechanism urges the shroud against the at least one elastomeric stop feature.

11. The process variable transmitter of claim 1, wherein the retaining mechanism comprises a snap.

12. The process variable transmitter of claim 1, wherein the spring-loaded electrical connectors comprise a conductive spring and an electrical pad.

13. The process variable transmitter of claim 1, wherein the second electronics board includes a display.

14. The process variable transmitter of claim 1, wherein the second electronics board is positioned in the housing, and the shroud abuts a cover coupled to the housing which urges the second electronics board against the first electronics board.

15. The process variable transmitter of claim 14, wherein the housing and the cover thread together.

16. A method of manufacturing a process variable transmitter of the type used in an industrial process, the method comprising:

providing a process variable sensor which senses a process variable of the industrial process;

providing a housing;

providing a first electronics board in the housing having circuitry configured to electrically couple to the process variable sensor;

providing a second electronics board electrically coupled to the first electronics board configured to provide an interface to the process variable transmitter;

electrically coupling the first electronics board to the second electronics board with a spring loaded electrical interconnection;

forming a shroud to hold the second electronics board in the housing;

forming at least one over-molded elastomeric stop feature on the shroud to protect the second electronics board from vibrations when the second electronics board is mounted in the shroud and thereby maintain an electrical interface between the first electronics board and the second electronics board urging the second electronics board against the at least one elastomeric stop feature with a locking mechanism, wherein the spring loaded electrical interconnection, locking mechanism and at least one elastomeric stop feature provides for limited motion of the second electronics board while absorbing and damping external shocks and vibrations.

17. The method of claim 16, including securing the second electronics board in the shroud with the locking mechanism and thereby urging the second electronics board against the at least one over-molded elastomeric stop feature.

* * * * *